(12) United States Patent
Lindberg et al.

(10) Patent No.: US 7,689,965 B2
(45) Date of Patent: Mar. 30, 2010

(54) GENERATION OF AN EXTRACTED TIMING MODEL FILE

(75) Inventors: Peter Lindberg, Maple Grove, MN (US); Richard K. Kirchner, Bloomington, MN (US); Sandeep Bhutani, Pleasanton, CA (US)

(73) Assignee: LSI Corporation, Milpitas, CA (US)

( * ) Notice: Subject to any disclaimer, the term of this patent is extended or adjusted under 35 U.S.C. 154(b) by 355 days.

(21) Appl. No.: 11/351,091

(22) Filed: Feb. 9, 2006

(65) Prior Publication Data

US 2007/0186198 A1  Aug. 9, 2007

(51) Int. Cl.
*G06F 17/50* (2006.01)

(52) U.S. Cl. .................................. 716/18; 716/1; 716/6

(58) Field of Classification Search .................... 716/1, 716/6, 18
See application file for complete search history.

(56) References Cited

U.S. PATENT DOCUMENTS

| 5,452,239 | A * | 9/1995 | Dai et al. ....................... 703/19 |
| 2003/0135834 | A1 * | 7/2003 | Tojima et al. .................. 716/10 |

* cited by examiner

*Primary Examiner*—Thuan Do
(74) *Attorney, Agent, or Firm*—Christopher P. Maiorana, PC

(57) ABSTRACT

A system, apparatus and method for generating extracted timing model files, such as macro library files, are disclosed. A user interface or data template is provided to an engineer that allows for the population of data within particular fields related to timing characteristics of an IP block, cell or core. Various types of data and fields may be provided into the user interface or data template. The location of relevant files, such as a cell or core netlist, may be provided within the template. Additionally, one or more modes may be selected by the user to define the manner in which the ETM file(s) are to be generated. An ETM file is automatically generated using the information provided in the data template.

18 Claims, 5 Drawing Sheets

GENERATION OF AN EXTRACTED TIMING MODEL FILE

BACKGROUND

A. Technical Field

The present invention relates generally to electronic design automation ("EDA") tools, and more particularly, to a tool for efficiently generating an extracted timing model file.

B. Background of the Invention

The importance and rapid growth of electronics technology is well known. Integrated electrical systems are continually being reduced in size while ever-increasing in design complexity. For example, a System-On-Chip ("SOC") may comprise a large number of macros or cores that are designed into a system by multiple engineers or engineering teams. Oftentimes, the design process of a SOC requires that timing components and characteristics of the macros or cores be provided to the various engineers to ensure compatibility between the macros within the SOC. These macros and cores generally include Intellectual Property blocks or cells ("cells") that allow the design to be reused across multiple systems, which further necessitates the need for modeling the timing characteristics of block, macro or core.

Timing characteristics of a cell may be described in an extracted timing model ("ETM"). An ETM describes timing components of the inputs and outputs of the cell. Accordingly, a designer can use an ETM to ensure that other cells within a macro, core and SOC are able to properly interface and effectively communicate within the system. ETMs may be difficult to generate depending on the complexity of the cell that is being modeled. Oftentimes, ETM files must be manually built in order to generate an ETM for a particular cell.

Once this ETM file is generated, it may be used internally within a company to design a system or provided to a customer to allow integration of a cell within a customer's system. One example of an ETM file is the library (".lib") file that corresponds to an original netlist for the cell. As shown in FIG. 1, a user 102 manually generates the .lib file 101 that describes timing characteristics of a cell. This .lib file may be provided to a vendor or customer 103 to allow proper integration of a corresponding cell within a system.

The .lib file contains information that describes timing arcs between input and output pins of a design cell. These timing arcs may contain timing tables which describe timing characteristics between the input and output pins. In particular, the timing tables define timing values as a function of input transition time. The .lib file may also contain min_periods and area_number attributes.

The .lib files containing timing arcs and tables are used for modeling the timing of input and output pins without involving actual internal nets implementation details. For instance, if a designer needs to integrate a number of different cells in the core, he/she makes use of these .lib files to gain the timing information of the core. Sometimes customers use the timing models depending upon the design stages.

PrimeTime™ is a gate-level static timing analysis tool that is optimized to analyze millions of gates in a short time. Manual generation of a .lib file to model the netlist for which an ETM file is generated may be required when using a delay calculator other than the PrimeTime™ calculator. In such an instance, an engineer is required to manually code the .lib file, which may be complicated and require a large amount of time. An engineer may want to avoid using the PrimeTime™ delay calculator because of the associated cost aspects or its inability to address other signal characteristics such as cross talk and noise.

The PrimeTime™ graphical user interface and command line may be complicated or otherwise difficult for an inexperienced engineer to properly generate an ETM. This interface and manual process of building a .lib file may be complicated, error prone and time consuming. PrimeTime™ also fails to provide certain boundaries or constraints during the generation of an ETM. For example, a user may incorrectly provide a signal frequency or period outside of an appropriate range. Other user input may fall outside of a particular operable boundary resulting in an inappropriate ETM.

SUMMARY OF THE INVENTION

The present invention provides an apparatus and method for generating extracted timing model files. In one embodiment of the present invention, an ETM software application is used in which a data template is created and provided. This data template allows the user to efficiently provide information related to a cell or core in response to inquiries or fields within the data template. One or more modes of operation for core operation are identified and location of netlists for core is provided to generate an ETM file, such as a .lib file.

According to one embodiment of the invention, the data template is a user interface comprising multiple rows and columns for allowing a user to enter required information related to timing characteristics of the core or cell. The information may include the location of relevant files, timing constraints, modes of operation, clock frequencies etc. The modes of operation may include various test modes and functional modes.

The data template and the information therein may be used to generate an ETM file. After the data template is filled out, the user may command that an ETM file, such as a .lib file, be generated accordingly. Timing constraint checking may be performed either after the ETM file is generated or during the generation process. Timing constraints are often the stumbling block for closing timing on a design and are also a crucial part of creating a good timing model.

In one embodiment of the invention, the invention may also create an "idealclk" mode equivalent for each functional mode. This is used for EDA tools that cannot handle real clock delay information, such as for pre-layout static timing analysis ("STA") or those tools optimizing the design before a clock tree is implemented. "Idealclk" means the timing arc is calculated with the clock delay portion of the arc zeroed out.

Further, the invention provides minimum period attributes to all source clocks to prevent the error of a user forgetting a source clock that is defined. Other cross-checking functionality may be provided such as having the minimum period attribute be specified for a clock that is not defined in the constraints.

In another embodiment, the invention provides a validation flow wherein all timing arcs in the ETM models are checked to know whether they match the timing of the gate level implementation within a specified range. The invention further verifies that all timing arcs are present in the ETM model. The list of timing arcs present is compared against those in the gate level netlist and a pass/fail type of check is provided without involving the timing.

Other objects, features and advantages of the invention will be apparent from the drawings, and from the detailed description that follows below.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

A system, apparatus and method for generating extracted timing model files, such as macro library files, are disclosed. A user interface or data template is provided to an engineer that allows for the population of data within particular fields related to timing characteristics of an IP block, cell or core (these terms are intended to be used synonymously and cover a circuit to be integrated within a larger system). Various types of data and fields may be provided into the user interface or data template. The location of relevant files, such as a cell or core netlist, may be provided within the template. Additionally, one or more modes may be selected by the user to define the manner in which the ETM file(s) are to be generated.

Using the data from the data template, a library file or files is generated describing the timing characteristics of a cell. In one embodiment, constraint checking is provided during this generation process. In another embodiment, constraint checking is performed once the library file or files have been generated. During the constraint checking process, data provided by the engineer is checked against multiple constraints to ensure that this data is valid and/or falls within an appropriate range.

In the following description, for purpose of explanation, specific details are set forth in order to provide an understanding of the invention. It will be apparent, however, to one skilled in the art that the invention may be practiced without these details. One skilled in the art will recognize that embodiments of the present invention, some of which are described below, may be incorporated into a number of different computing systems and devices. The embodiments of the present invention may be present in hardware, software or firmware. Structures and devices shown below in block diagram are illustrative of exemplary embodiments of the invention and are meant to avoid obscuring the invention. Furthermore, connections between components within the figures are not intended to be limited to direct connections. Rather, data between these components may be modified, reformatted or otherwise changed by intermediary components.

Reference in the specification to "one embodiment" or "an embodiment" means that a particular feature, structure, characteristic, or function described in connection with the embodiment is included in at least one embodiment of the invention. The appearances of the phrase "in one embodiment" in various places in the specification are not necessarily all referring to the same embodiment.

A. Overview

Figure 1:
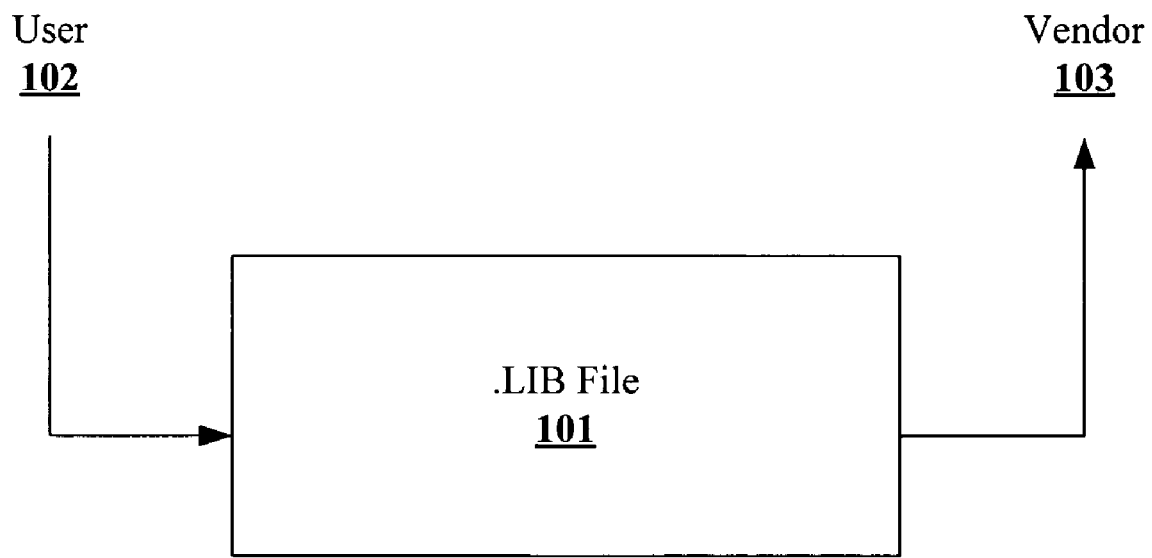
FIG. 1 illustrates a general prior art method for providing a .lib file or ETM that may be used to install a cell within a system.
Figure 2:
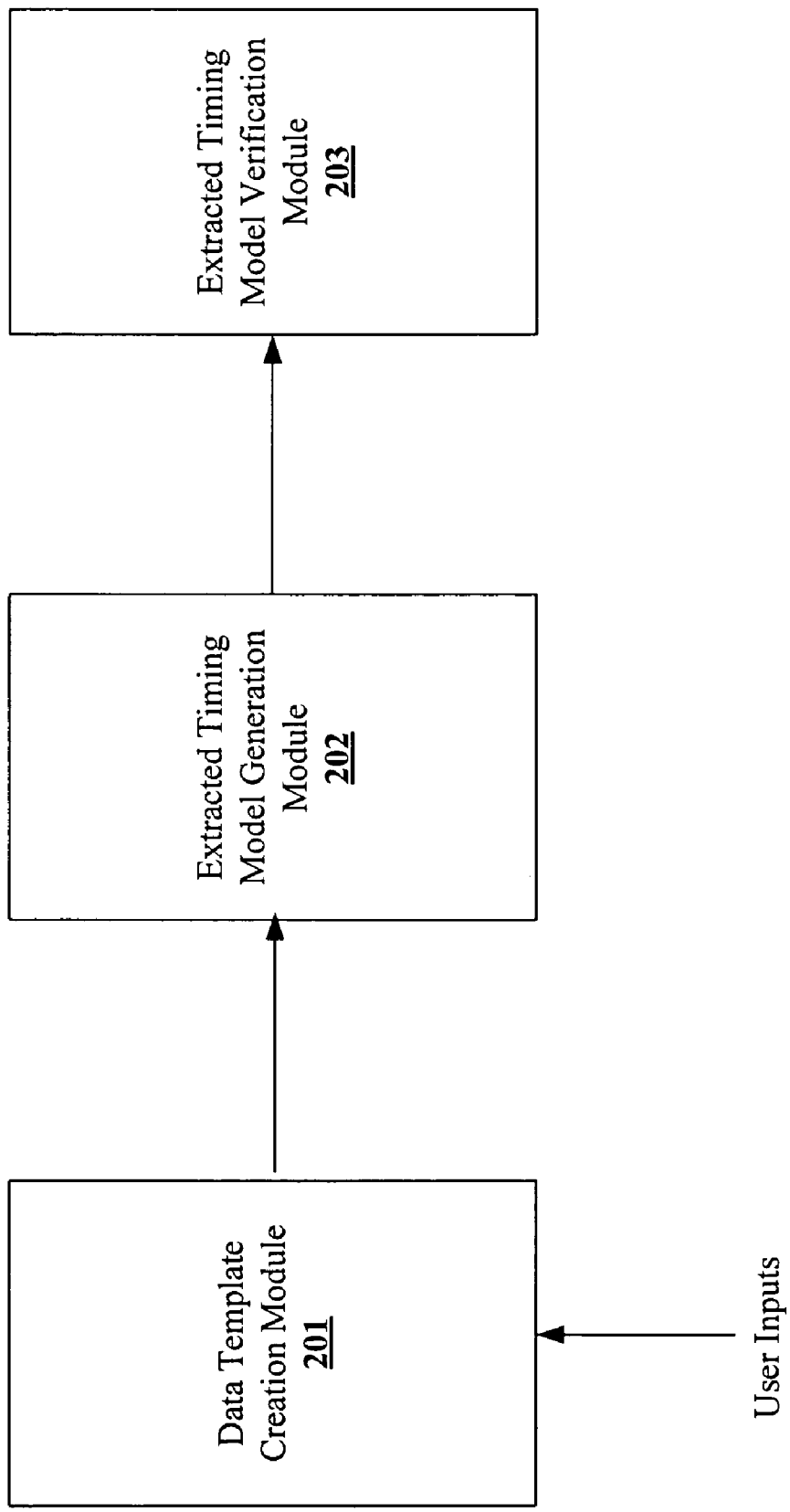
FIG. 2 is a general diagram illustrating a system in which an extracted timing model is generated and validated according to one embodiment of the invention.

FIG. 2 illustrates a system for efficiently generating an ETM file for a cell or core according to one embodiment of the invention. A user interface or Data Template Creation Module 201 is provided that allows an individual to input certain information relevant to the timing characteristics of a cell. In one embodiment of the invention, the Data Template Creation Module 201 contains a list of fields in which response to questions or locations of files may be provided by the individual. These fields may allow for yes/no responses, responses which may fall within a range of values, open-ended responses or other types of responses. The user interface that facilitates these responses may vary depending on various factors including the type of customer/individual or company using the Data Template Creation Module 201.

The user input may include information such as technology of the core that is being used, or any special custom required by the core itself or for reference. The user may also be asked for the location of any cell related to the core. Typically, the Data Template Creation Module 204 may ask for the core netlist, but this data on the internal net may not be required. For example, an internal source clock may require a certain ramp time on a particular net, but if a core netlist does not have such an internal source clock then this information need not be provided.

The user may be asked to provide a map file, which may be used to create the main mapping file containing the mapping information of the inputs and output pins. Furthermore, the data template file can also include source clock name with specified max frequencies or min periods. It can also have the information such as the speed of the core, which may be high or low. For example, if the core is a high-speed core, the user may be further queried to specify the location of the incremental sdf. file related to the high-speed core. Using the completed Data Template Creation Module 201, a file is created containing information relevant to timing characteristics of the cell.

An Extracted Timing Generation Module 202 processes the information within the Data Template Creation Module 201 and creates a corresponding ETM .lib file. In one embodiment of the invention, the Extracted Timing Generation Module 202 operates according to one of a plurality of modes of operation. These modes may include various test modes and functional modes. The user will identify one or more mode in which the core needs to operate so that the ETM may be generated.

Thereafter location of net list for core is provided in order to generate the .lib file for the ETM. Once the ETM .lib file is created, it is set for validation in the ETM Verification Module 203, which validates the ETM .lib file relative to one or more benchmarks or constraints corresponding to the cell or core being modeled.

In one embodiment of the invention, timing arcs in the ETMs are checked to determine whether they match the timing of the gate level implementation within a specified range. The invention may further verify that all timing arcs are present in the ETM model. The list of timing arcs present is compared against those in the gate level netlist and a YES/NO type of check may be provided without involving the timing.

B. Data Template Creation Module

Figure 3:
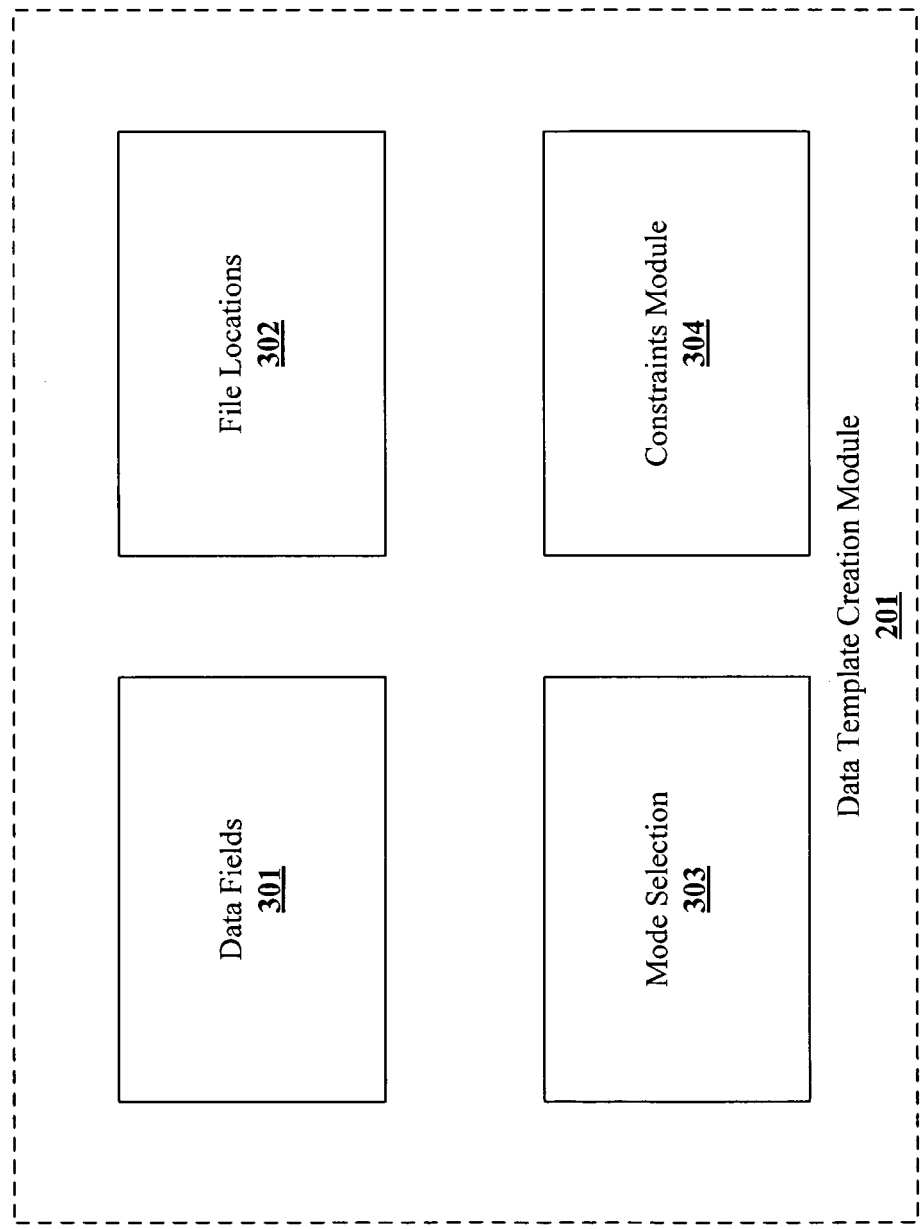
FIG. 3 illustrates an apparatus for creating and providing data templates used to generate an extracted timing model according to one embodiment of the invention.

FIG. 3 illustrates one embodiment of the Data Template Creation Module 201. This module 201 comprises different sub-modules including Data Fields 301, File Locations 302, Mode Selections 303 and a Constraint Module 304. As explained earlier, the Data Template Creation Module 201 is provided to the user to input various details about a cell or core including what type of technology is being modeled, location of relevant files including spef. files and verilog netlists, map files, source clock names, minimum periods and maximum clock frequencies, rate characterizations of the core, timing constraints, modes of operation, other clock frequencies etc. The various sub-modules allow a user to input this information within the Module 201 itself via a user interface or in response to a particular questions generated by the Module 201.

The Constraint Module 304 provides timing constraints for timing arcs from clock data output pin. These timing arcs in the ETM models are checked to determine whether they match the timing of the gate level implementation within a specified range. For example if the range is set to be +/−25 ps, then an error may be flagged if the ETM timing arc is say 370 ps but the gate level timing arc is 420 ps.

Additionally, the present invention provides an easy process of creating delay tables inside the models. The invention enables the user to manipulate the delay tables according to the change in cross talk margin flow that changes according to the core speed and the tables may be updated to interpret this timing information accordingly.

The timing information may also change with modification to the modes of operation. These modes include plurality of test modes and the functional modes. Depending upon which mode a cell or core is operating, the timing behaviors and characteristics of the cell or core may change. These changes may be modeled within the ETM and a switch provided to change the mode of operation and to update the timing information accordingly.

C. Extracted Time Model Generation Module

Figure 4:
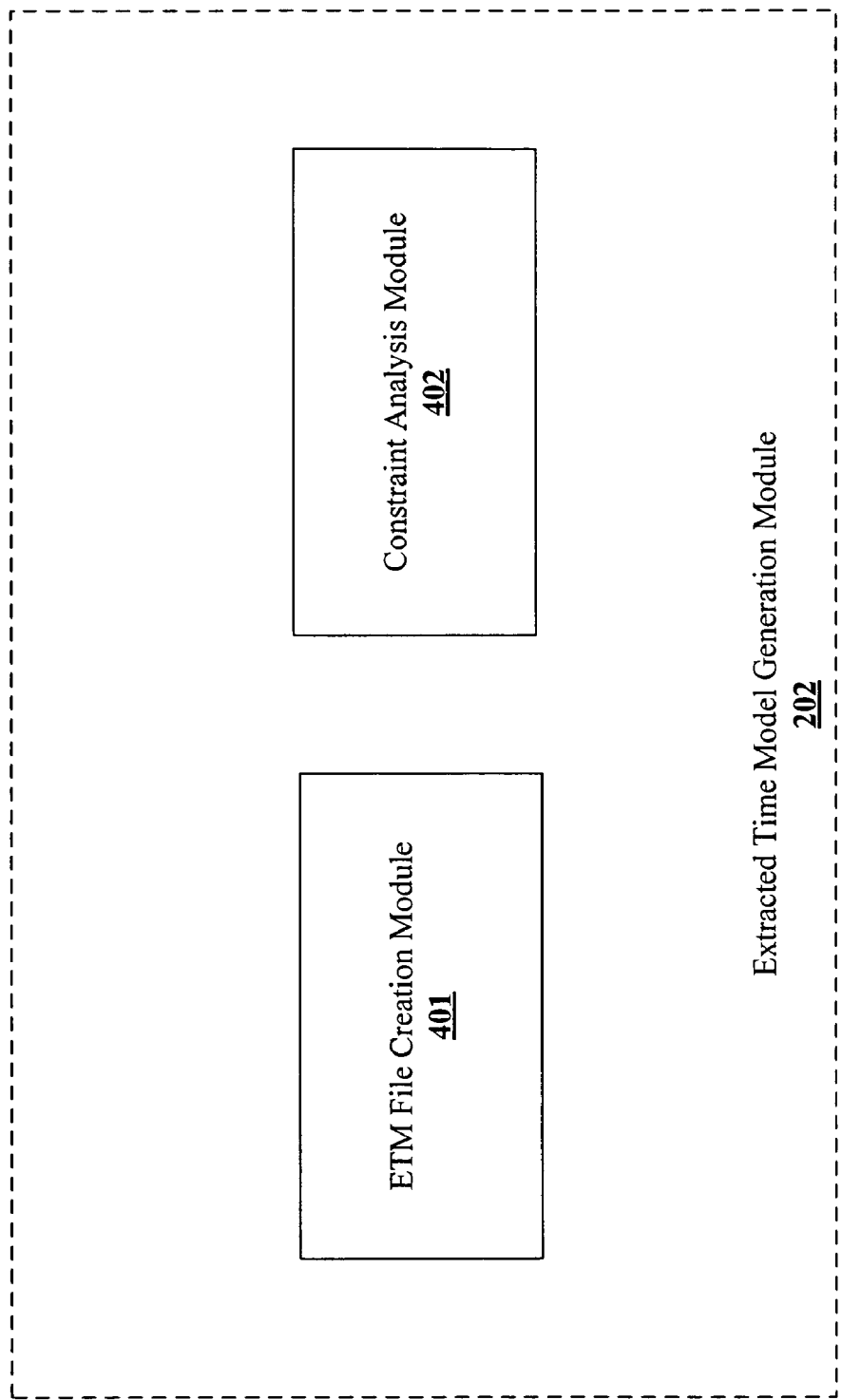
FIG. 4 illustrates an apparatus for generating an extracted timing model according to one embodiment of the invention.

FIG. 4 shows the Extracted Time Model Generation Module 202 according to one embodiment of the invention. As shown in this embodiment, the Module 202 contains a .LIB File Creation Module 401 and the Constraint Analysis Module 402. The .LIB File Creation Module 401 receives the information in the Data Template Creation Module 201 and generates a .lib file and .db file. As explained above, the library file is created so that the timing information of an IP block, cell and/or core can be calculated and the library cell can replace the internal netlist of a design. The timing tables in the library file may be modified by using this Module 202.

The Constraint Module 402 verifies that the generated .lib file is consistent with one or more test criteria. For example, a certain core, or system in which the core is to be integrated, may require a minimum period on all clocks. In order to ensure that a user does not erroneously define a clock period below the minimum period, the user entry may be verified relative to this minimum clock period. One skilled in the art will recognize that numerous different core characteristics may be monitored and verified by the Module 402 to ensure that an appropriate file is generated.

Timing constraints are often the stumbling block for closing timing on a design and are also a crucial part of creating a good ETM. This constraint checking may be hidden from the user or may include active participation by the user. At the end of the ETM run, a .lib model and a .db model are created.

In one embodiment of the invention, the Extracted Time Model Generation Module 202 may also generate an "idealclk" mode equivalent for each functional mode. This particular mode is used for EDA tools that are unable to handle real clock delay information, such as a pre-layout STA or those tools optimizing the design before the clock tree is implemented. In one embodiment of the invention, "idealclk" means the timing arc is calculated with the clock delay portion of the arc zeroed out.

The invention generates and validates complex ETM models for hardmacro blocks. It allows IP designers who are not experts in PrimeTime™ and timing model abstraction to create signoff quality complex multi-mode ETM models. One important aspect of the invention is the ease of use of the simple user-interface mechanism provided by a data template file, which can be edited by the user.

D. Method for Generating an ETM File

Figure 5:
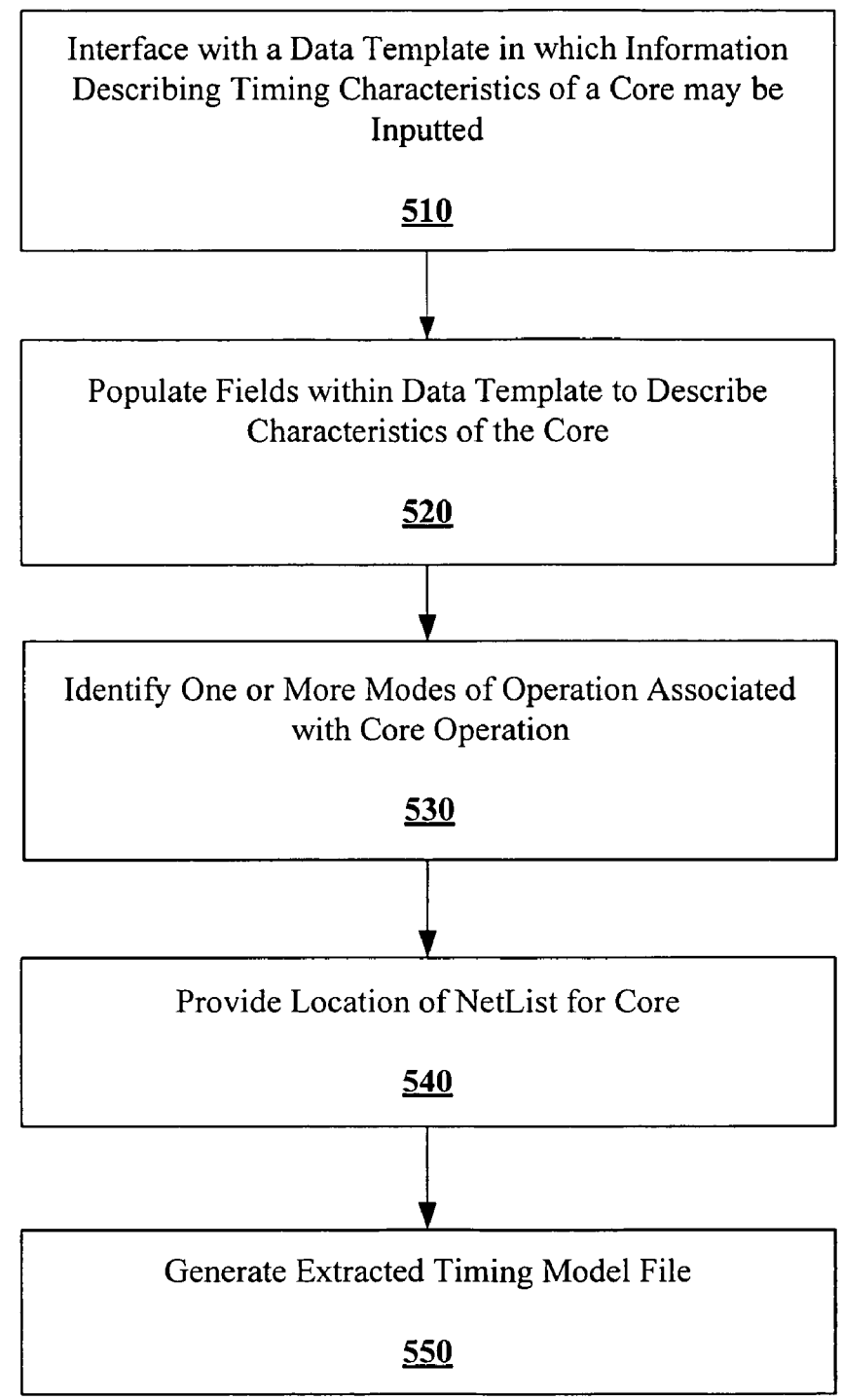
FIG. 5 illustrates a method that generates an extracted timing model according to one embodiment of the invention.

FIG. 5 illustrates a method, independent of structure, for generating an ETM file, such as a .lib file, according to one embodiment of the invention. A user interfaces 510 with a data template that will be used to generate an ETM file. This data template may receive and contain information describing timing characteristics of a core and may provide specific questions intended to illicit this information.

The user populates 520 fields within the data template in order to provide this timing characteristic information. The fields may be provided in various formats depending on the type of question associated with the field or particular application of the information. The user may also identify 530 one or more modes of operation associated with the core operation. Additionally, the user may provide 540 a location or file address of a core netlist and/or other related files describing the core.

Using the information within the data template, including the modes of operation and file locations, an ETM file is automatically generated 550. This file may be various types of ETM files including a .lib file or .spef file. This automated file generation greatly reduces the time expenditure and complexity of creating ETM files prior to the invention.

The foregoing description of the invention has been described for purposes of clarity and understanding. It is not intended to limit the invention to the precise form disclosed. Various modifications may be possible within the scope and equivalence of the appended claims.

We claim:

1. A method for generating extracted timing model files, the method comprising:
    providing a data template in which information describing timing characteristics of a core is entered by a user using a computer;
    populating at least one field within the data template with information describing timing characteristics of the core based upon information received from the user via said computer;
    identifying at least one mode of operation associated with the core, from a plurality of available modes of operation for the core, using at least one field within the data template, based upon information received from the user via said computer; and
    automatically generating an extracted timing model file using the information within the data template and storing the extracted timing model file on a computer readable medium.

2. The method of claim 1 further comprising the step of providing at least one file location within the data template.

3. The method of claim 2 wherein the at least one file location includes an address of the core netlist.

4. The method of claim 2 wherein the at least one file location includes an address of an .spf file associated with the core.

5. The method of claim 1 wherein the extracted timing model file comprises a .lib file.

6. The method of claim 1 wherein the data template comprises a plurality of questions and a plurality of fields in which answers to the plurality of questions are entered.

7. The method of claim 6 wherein a field, within the plurality of fields, allows the user to provide information about the technology related to the core.

8. The method of claim 6 wherein a field, within the plurality of fields, allows the user to provide the location a core map file.

9. The method of claim 6 wherein a field, within the plurality of fields, allows the user to provide at least on clock frequency within the core.

10. The method of claim 1 wherein the at least one mode of operation includes a test mode for the core.

11. The method of claim 1 wherein the at least one mode of operation includes a functional mode for the core.

12. The method of claim 1 wherein at least one constraint check is performed during the automatic generation of the extracted timing model file.

13. The method of claim 1 wherein at least one constraint check is performed after the automatic generation of the extracted timing model file.

14. A computer program product embodied on a computer readable medium for creating an extracted timing model file, the computer program product comprising computer executable instructions for causing a computer to perform the steps of:

provimportanting a data template into which information describing timing characteristics of a core is entered in response to a user input;

populating at least one field within the data template with information describing timing characteristics of the core based upon the user input;

identifying at least one mode of operation associated with the core, from a plurality of available modes of operation for the core, by populating at least one field within the data template, based upon the user input; and automatically generating the extracted timing model file using the information within the data template.

15. The computer program product of claim 14 wherein the at least one mode of operation comprises a test mode for the core or a function mode for the core.

16. The computer program product of claim 14 wherein the extracted timing model file comprises a .lib file.

17. The computer program product of claim 14 further comprising identifying at least one file associated with the core by entering at least one file location in at least one field within the data template based upon the user input.

18. The computer program product of claim 17 wherein the at least one file location includes an address of the core netlist.

* * * * *